Sept. 11, 1956 H. C. GOODRICH 2,762,873

TRANSISTOR BIAS CIRCUIT WITH STABILIZATION

Filed June 30, 1953 2 Sheets-Sheet 1

INVENTOR.
HUNTER C. GOODRICH

BY H. C. Newton
ATTORNEY

INVENTOR.
HUNTER C. GOODRICH

BY H. L. Muston

ATTORNEY

United States Patent Office 2,762,873

Patented Sept. 11, 1956

2,762,873

TRANSISTOR BIAS CIRCUIT WITH STABILIZATION

Hunter C. Goodrich, Collingswood, N. J., assignor to Radio Corporation of America, a corporation of Delaware Application June 30, 1953, Serial No. 365,149

7 Claims. (Cl. 179—171)

This invention relates generally to semi-conductor signal circuits and particularly to semi-conductor signal amplifier circuits of the feedback type.

When utilizing circuits employing semi-conductor devices such as transistors, it is, of course, desirable when necessary to be able to replace the transistor in the circuit without having to readjust the circuit for satisfactory operation. Howver, it has been found that both the dynamic and static characteristics of transistors vary appreciably from one unit to another even though effort is directed to making them identical with each other. Accordingly a circuit which has been adjusted to operate satisfactorily with one transistor may be found to be less satisfactory or even inoperative with a second transistor due to the difference in the transistor characteristics.

Further it is desirable from the aspect of convenience, economy and bulk to operate circuits employing semi-conductor devices from a single source of direct current voltage. Since the various electrodes of the transistor must be maintained at a different voltage level, some means of biasing or selecting the required voltage levels must be utilized when operating such circuits from a single source of direct current voltage. One such circuit providing a bias arrangement for a transistor is disclosed in U. S. Patent No. 2,517,960 granted to H. L. Barney et al., August 8, 1950, for "Self-Biased Solid Amplifier." The patentee describes a self-biasing arrangement wherein it is possible to bias the base electrode with respect to the other electrodes. However, it has been found that known self-biasing circuits do not adapt themselves adequately to transistors of varying operating characteristics.

Accordingly it is an object of this invention to provide a stable and efficient circuit utilizing semi-conductor devices of the type exhibiting a phase reversal and in more particularity to provide such a circuit which is suitable for use as an amplifier.

It is a further object of the present invention to provide an improved amplifier circuit utilizing semi-conductor devices of the type exhibiting a phase reversal which enables ready and satisfactory operation with semi-conductor devices having different operating characteristics.

Another object of the present invention is to provide an improved amplifier circuit utilizing semi-conductor devices of the type exhibiting a phase reversal wherein differences in the semi-conductor devices will involve in a circuit changed only by a substitution of one semi-conductor device for another, respectively different values of base electrode current which will react to affect stabilization of operation with the different devices.

It is a further object of this invention to provide a direct current stabilizing amplifier circuit which enables the utilization therein of semi-conductors having dissimilar characteristics and in which alternating current degeneration may be minimized.

In accordance with the present invention there is provided a semi-conductor device of the junction or other type which exhibits a phase reversal and comprising a semi-conductive body having a base electrode, a collector electrode and an emitter electrode in engagement therewith. It is, of course, understood that a point contact transistor having an alpha of less than one may exhibit a phase reversal between the base and collector electrodes. In the illustrated embodiment an input signal is coupled between the base electrode and the emitter electrode and an output signal is derived from a load impedance which is connected between the collector electrode and the emitter electrode. Direct current stabilization is provided by a direct current degenerative connection comprising a direct current conductive impedance means connected directly between the collector electrode and the base electrode. The effect of this direct current degenerative stabilization is enhanced or amplified by virtue of the series arrangement of a source of direct current biasing voltage and an impedance element being connected directly between the base electrode and the emitter electrode. In this manner the base electrode current of an individual semi-conductor device is determined primarily by the value of the impedance means and the collector electrode voltage.

In another aspect of the present invention the output impedance may comprise a parallel resonant tuned circuit and a direct current impedance element serially connected between the collector electrode and a source of direct current voltage. In this embodiment the degenerative feedback connection is made between the base electrode and the junction of the parallel resonant tuned circuit and the direct current impedance element. In this manner the various features of the present invention may be utilized in tuned amplifier circuits.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
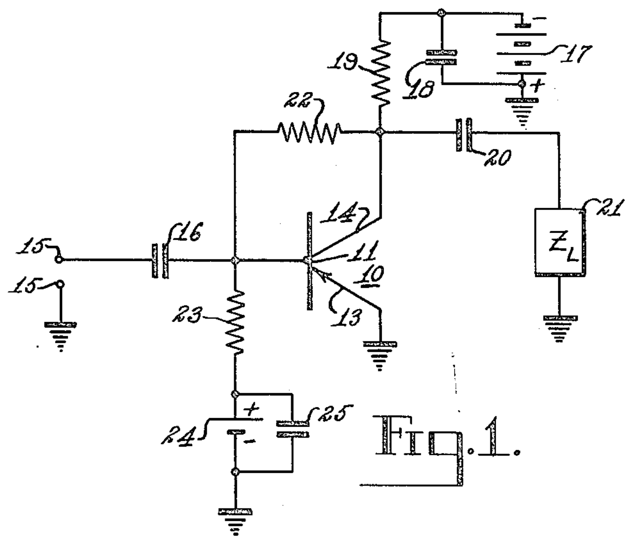
Figure 1 is a schematic circuit diagram of a semi-conductor circuit illustrating one embodiment of the present invention.

Referring now to the drawing wherein like reference characters are used to designate like elements throughout the several figures and particularly to the amplifier circuit shown in Figure 1, a transistor 10 is provided as an amplifier device. This may be of the point contact type which exhibits a phase reversal or it may be of the junction type. It should be understood, however, that the transistor 10 should be of the type having a signal phase reversal between its collector and base electrodes. Such a transistor will also exhibit a current gain of less than unity as defined by the ratio of collector current increments to emitter current increments. It comprises a semi-conductive body 11 which may be of either conductivity type, but in Figure 1 it is assumed to be of the P–N–P junction type and it further includes a base electrode 12, an emitter electrode 13 and a collector electrode 14.

Input signals from a signal source may be coupled to a pair of input terminals 15, one of which is connected to a point of fixed reference potential such as ground and the other of which is connected to the base electrode 12 through a coupling capacitor 16. In order to complete the input circuit, the emitter electrode 13 is also connected directly to ground. Energizing potentials may be provided from any convenient source which by way of illustration is shown as a battery 17 having the positive terminal connected directly to ground and which is bypassed at signal frequencies by a capacitor 18.

The negative terminal of the battery 17 is connected to the collector electrode 14 through a collector electrode load impedance illustrated as a resistor 19 thereby providing a bias in the reverse direction, that is, in the difficult current flow direction between the collector electrode and the base electrode and a bias in the forward direction, that is, in the direction of easy current flow between the emitter electrode and the base electrode.

An output circuit is provided by means of a coupling capacitor 20 and an output load element 21 represented as a rectangle containing the legend $Z_L$ which are connected in series arrangement between the collector electrode 14 and ground.

Stabilization for the circuit is provided by a pair of stabilizing impedance elements 22 and 23 and a further source of direct current bias voltage illustrated as a battery 24. Accordingly the first stabilizing impedance element illustrated as a resistor 22 is connected directly between the collector electrode 14 and the base electrode 12, and the second stabilizing impedance element 23 illustrated as a resistor is connected in series arrangement with the battery 24 between the base electrode 12 and ground. The battery 24 may be bypassed at signal frequencies by a capacitor 25.

Under static conditions, that is, in the absence of an applied input signal, certain currents flow in the circuit of Figure 1 which for later convenience will now be defined in accordance with usual terminology. The larger current passes through the emitter electrode 13. Part of this current goes through the body of the transistor 11 to the collector electrode 14 through the collector electrode load resistor 19, the battery 17 and back to the emitter electrode 13. This current is called the collector electrode current.

A small portion of the emitter electrode current passes through a portion of the body 11 to the base electrode 12 and through the stabilizing resistor 22, the load resistor 19 and the battery 17 back to the emitter electrode 13. Such current is called the base current.

Due to the arrangement of the second stabilizing resistor 23 and the battery 24, a current also flows from the positive terminal of the battery 24 through the second stabilizing resistor 23, the first stabilizing resistor 22, the load resistor 19 and the battery 17 back to the negative terminal of the battery 24.

It should also be noted at this time that the voltage drop existing across the body 11 between the emitter electrode 13 and the collector electrode 14 is called the collector electrode voltage.

It may also be noted that the emitter electrode current is regarded as the sum of the collector electrode current and the base electrode current. The magnitude of the collector electrode current will depend upon the particular transistor characteristics and upon the magnitude of the base electrode current, which as will be more fully described hereinafter, is determined by the stabilization circuit.

The manner of the advantageous operation of the circuit provided by the present invention as now understood will be explained with reference first to the operation of a transistor circuit wherein the stabilization circuit as provided by the present invention is not utilized.

In a transistor amplifier circuit of the grounded emitter base input type as is illustrated in Figure 1, the average base current is normally small compared with the collector electrode current. However, the exact value of the base electrode current is extremely important since it determines the average collector electrode current. In the present state of the art a representative group of six transistors adjusted to operate with a collector electrode current of two milliamperes may exhibit a base electrode current anywhere from 12 to 96 microamperes. Accordingly if an arbitrary value of base electrode current such as zero were used in a given circuit, the operating points of the various transistors when placed in this circuit might vary between nearly complete collector electrode cutoff and collector electrode saturation.

However, with the advantageous operation as provided by the present invention operation on any desired portion of the collector electrode characteristic may be obtained with different transistors substituted in the circuit without the necessity of adjusting any of the circuit elements.

In the copending application of F. D. Waldhauer, Serial No. 320,765, filed November 15, 1952, and entitled "Semi-Conductor Director Current Stabilization Circuit" there is described and claimed a stabilization circuit employing only the first stabilizing resistor 22 connected directly between the collector electrode and the base electrode of a transistor amplifier device. It is therein described that the voltage existing at the collector electrode of a transistor acts effectively as the bias voltage applied to the base electrode through the compensating or stabilizing resistor. Accordingly a larger bias voltage is effective at the base electrode when a smaller collector electrode current is drawn which causes the needed larger base electrode bias current. The larger base electrode bias current is accompanied by a larger collector electrode current since the magnitude of the collector electrode current is directly proportional to the magnitude of the base electrode current. Accordingly a large collector electrode current passing through the collector electrode load resistor 19 will in turn reduce the negative voltage at the collector electrode which it can be seen will thereby cause a reduction of the initial effect of the larger base bias current. Thus the collector electrode current will increase until a value is reached such that a sufficient base electrode bias current is provided to maintain that value of collector electrode current.

The stabilizing effect which is produced solely by the stabilizing resistor 22 may be amplified in accordance with the present invention as will now be described.

In determining the circuit parameters for a circuit in accordance with the present invention, the voltage of the battery 24 and the resistance of the resistor 23 are preferably chosen so that the current in the branch of the circuit represented by the stabilizing resistor 23 and the battery 24 is several times the magnitude of the required base electrode current. The desired zero signal value of the collector electrode voltage as above defined is then chosen. For a symmetrical signal this will probably be essentially one half of the voltage of the battery 17 since this will permit the greatest swing in output signal before reaching cutoff or saturation. The resistance of the first stabilizing resistor 22 is then chosen so that the current flowing through it will be equal to the sum of the base electrode current and the current through the second stabilizing resistor 23. It is then apparent that the base current is then the difference between the larger quantity, which is the current through the first stabilizing resistor 22, and the smaller quantity, which is the current through the second stabilizing resistor 23. The current through the second stabilizing resistor 23 is determined primarily as above described by the voltage of the battery 24 and the resistance of the stabilizing resistor 23. The current through the first stabilizing resistor 22 is proportional to the collector electrode current. Thus if the transistor 10 is replaced by another transistor requiring a different base electrode current, the collector electrode voltage will tend to change and will need to change only slightly to produce the required much greater percentage change in the base electrode current. The system is accordingly stabilized against changes in transistor characteristics since any change in collector electrode current automatically produces a much larger percentage change in the base electrode current which largely counteracts the initial change.

It has been found that when utilizing an amplifier circuit in accordance with the present invention and substituting therein transistors from a group of six transistors of the 2N33 type having base to collector current gains varying from 22 to 100 that without stabilization the collector electrode currents varied as much as 3 to 1 and that with stabilization as provided by the present invention, the variation in collector electrode currents was only 1.12 to 1.

It is noted that maximum stabilization is provided by this invention when the collector electrode load resistance illustrated as the resistor 19 in Figure 1 is large relative to the effective direct-current resistance of the collector to emitter path of the transistor, this latter resistance being defined as the quotient of the direct collector voltage divided by the direct collector current. Thus, stabilization is increased with an increase in the ratio of the direct voltage across the resistor 19 to the voltage at the collector electrode 14. This effective direct current resistance of the transistor, which may vary according to the operating point, may be determined for any given operating point by dividing the direct collector voltage by the direct collector current. This effective direct current resistance is to be contrasted to the internal generator resistance (i. e., internal output resistance) of the transistor which in a typical case may be 30,000 ohms. Moreover the resistance of the collector electrode load impedance is preferably small relative to the resistance of the stabilizing impedance element which is represented by the resistor 22 connected between the collector electrode 14 and the base electrode 12.

When the resistance values of these elements are thus selected and further in accordance as above described the current variations which occur in the collector electrode circuit offer a maximum correction by providing a relatively large stabilizing or correcting voltage variation which will operate to vary the base electrode bias current.

It is, of course, to be understood that the polarity of the batteries 17 and 24 is merely for the purpose of illustration and is in the proper direction for an N type point contact transistor or a P–N–P junction transistor. If another type of transistor such as a P type point contact transistor or an N–P–N junction transistor were used, the polarity of the batteries would have to be reversed from that shown.

Figure 2:
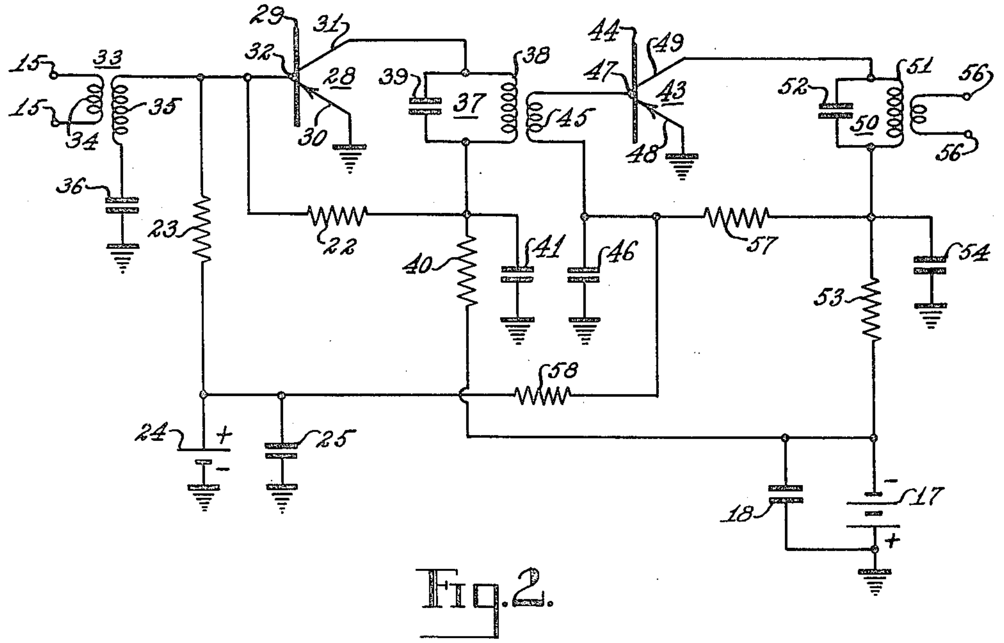
Figure 2 is a schematic circuit diagram of two cascaded semi-conductor amplifiers illustrating a further embodiment of the present invention.

In the embodiment of the invention illustrated in Figure 2 a transistor 28 is provided which comprises a semi-conductive body 29 such as a germanium crystal of the N or P type conductivity if the transistor 28 is a point contact transistor or which may be a similar semi-conductive body including alternate zones of opposite conductivity type if the transistor 28 is a junction transistor. However, the polarity of the battery 17 in Figure 2 as in Figure 1 is appropriate if the transistor 29 is of the P–N–P junction type or N type point contact.

An emitter electrode 30, a collector electrode 31 and a base electrode 32 are each in contact with a semi-conductive body 29. An input circuit is represented by an input transformer 33 having a primary winding 34 provided with a pair of input terminals 15 and a secondary winding 35 which is connected to the base electrode 32 and which is also connected through a D.-C. blocking capacitor 36 to a point of fixed reference potential such as chassis ground. A collector electrode load circuit is represented by a parallel resonant tank circuit 37 including an inductor 38 and a capactior 39 connected in series with a direct current load impedance element represented as a resistor 40 between the collector electrode 31 and the negative terminal of the battery 17. The battery 17 may be bypassed at signal frequencies by a capacitor 18 connected in shunt with the battery 17. A first stabilizing element illustrated as a stabilizing resistor 22 is connected between the base electrode 32 and the junction of the parallel resonant tank circuit 37 and the D.-C. load impedance element 40. As above described, further stabilization is provided by the circuit by means of a second stabilizing element illustrated as a resistor 23 connected in series with a second source of direct current voltage illustrated as a battery 24 between the base electrode 32 and ground. The battery 24 also may be bypassed at signal frequencies by a capacitor 25 connected in shunt therewith. In order to maintain the junction of the stabilizing resistor 22 and the parallel resonant tank circuit 37 at signal ground potential, a bypass capacitor 41 may be connected between this point and ground.

The second stage of the cascade-coupled amplifier circuits is arranged in a circuit substantially identical with that above described and includes a transistor 43 which comprises a semi-conductive body 44 which due to the biasing arrangement, should be of the same crystal type as the semi-conductive body 29 of the transistor 28. An input inductor 45, which is inductively coupled to the inductor 38, is connected in series with a direct current blocking capacitor 46 and the base electrode 47 of the transistor 43. In order to complete the input circuit for the transistor 43, the emitter electrode 48 is connected to chassis ground.

An output load is provided for the collector electrode 49 by means of a parallel resonant tank circuit 50 including an inductor 51 and a capacitor 52 connected in series with a D.-C. impedance element illustrated as a resistor 53 between the collector electrode 49 and the negative terminal of the battery 17. In order to maintain the junction of the parallel resonant tank circuit 50 and the resistor 53 at signal ground potential, a bypass capacitor 54 may be connected between this junction and ground. An output circuit is provided by means of an inductor 55 which is provided with a pair of output terminals 56 and which is inductively coupled to the inductor 51.

Stabilization for the second transistor 43 is provided by means of a stabilizing resistor 57 which is connected between the junction of the input inductor 45 and the D.-C. blocking capacitor 46 and the junction of the parallel resonant tank circuit 50 and the resistor 53. Further stabilization is provided by a second stabilizing impedance element illustrated as a resistor 58 connected between the positive terminal of the battery 24 and the junction of the input inductor 45 and the direct current blocking capacitor 46.

The operation of the cascade circuit illustrated in Figure 2 is substantially identical with the operation of the amplifier circuit illustrated in Figure 1. The essential difference lies in the inclusion of the parallel resonant tuned circuits 37 and 50 between the direct current load resistors 40 and 53 and their respective collector electrodes 31 and 49. Accordingly the stabilization action provided by the circuit arrangement of Figure 2 functions in the same manner as that illustrated in Figure 1 with the direct current load impedance elements 40 and 53 performing the function above described in connection with the load resistor 19 of Figure 1. The advantage obtained by this circuit is that a tuned amplifier circuit can be utilized while still retaining the advantageous operation as provided by the stabilization circuit in accordance with the present invention.

Figure 3:
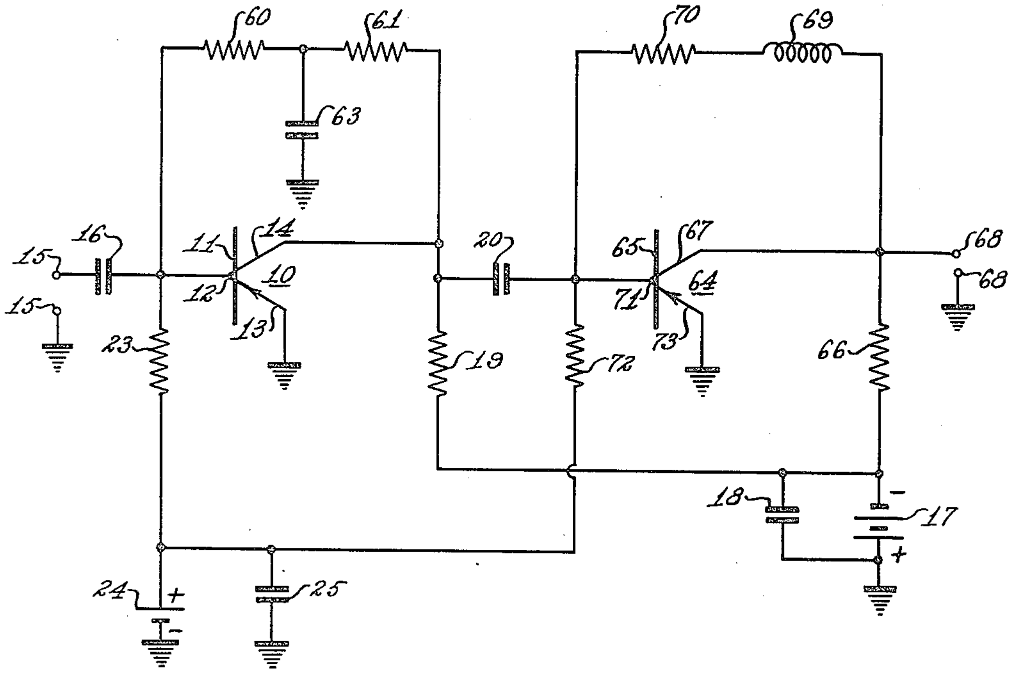
Figure 3 is a schematic circuit diagram of two cascaded semi-conductor amplifiers illustrating a still further embodiment of the present invention.

The first stage of the resistance coupled-cascade amplifier circuit illustrated in Figure 3 is substantially identical with the circuit illustrated in Figure 1 except that the first stabilization resistor 22 of Figure 1 has been replaced in Figure 3 by a pair of stabilization impedance elements illustrated as resistors 60 and 61 serially connected between the collector electrode 14 and the base electrode 12. The junction of the two stabilization resistors 60 and 61 is bypassed to ground by a capacitor 63.

The load impedance element illustrated in Figure 1 as a rectangle 21 has been replaced in Figure 3 by a second transistor amplifier stage comprising a transistor 64 comprising a semiconductive body 65 which as described in connection with Figure 2 should be of the same conductivity type as the semi-conductive body 11. Bias voltages are applied to the transistor 64 by means of a load impedance element illustrated as a resistor 66 connected between the negative terminal of the battery 17 and the collector electrode 67. An output circuit is provided by means of a pair of output terminals 68 one of which is connected to the collector electrode 67 and the other of which is connected to ground.

Direct current stabilization for the transistor 64 is provided by an inductor 69 and a first stabilizing resistor 70 connected in series arrangement between the collector electrode 67 and the base electrode 71. A second stabilizing element illustrated as a resistor 72 is connected between the base electrode 71 and the positive terminal of the battery 24. The input circuit for the transistor 64 is completed by connecting the emitter electrode 73 to ground.

As mentioned above in connection with Figure 2 the mode of operation of the cascade amplifier circuit illustrated in Figure 3 is essentially the same as described in connection with Figure 1. However, the stabilization arrangement provided in Figure 1 will provide in addition to direct current stabilization a degenerative path for alternating current voltages which are developed in the collector electrode circuit. The direct current stabilizing circuit as provided by the pair of stabilizing resistors 60 and 61 and the bypass capacitor 63 and also the stabilizing circuit provided by the inductor 69 and the resistor 70 permit changes in the direct current potential of the collector electrode to affect the base electrode current of the transistor. However, the high alternating current impedance of the inductor 69 is operative to effectively isolate the input circuit from the output circuit from an alternating current aspect. Further, the bypass capacitor 63 is also effective to isolate the input circuit from the output circuit from an alternating current point of view. Accordingly these circuits maintain all of the advantages of direct current stabilization and also effectively reduce any alternating current degenerative effects.

The impedance ratio considerations discussed above in connection with Figure 1 are complied with in the cascade-coupled amplifier circuits illustrated in Figures 2 and 3. As noted above, the output circuit impedance should be low relative to the collector electrode load impedance at signal frequencies. The impedance offered by the second transistors 43 and 64 in the two cascade-coupled circuits since a base electrode input circuit is used, is normally in the order of 500 ohms, and the impedance of the collector electrode load resistors such as the load resistors 19 and 66 would normally be in the order of 10,000 ohms. Accordingly it is readily seen that the impedance ratios above discussed are met in the circuits illustrated in Figures 2 and 3. Accordingly it is readily seen that the requirements for direct current stabilization are met.

It is thus seen that a stabilized transistor amplifier circuit which is consistent in operation irrespective of variations in the characteristics of the transistors used therein may be provided in accordance with the present invention for various uses. There is an economy in the number of circuit elements required. The circuit is capable of satisfactory and predictable operation without adjustment even though transistors having widely varying characteristics are interchangeably used therein.

What is claimed is:

1. A semi-conductor amplifier circuit, comprising in combination, a semi-conductor device including a base electrode, an emitter electrode and a collector electrode and exhibiting the characteristic of providing a phase reversal between the base and collector electrodes, means for applying an input signal to said base electrode and said emitter electrode, signal output means including a load impedance coupled between said collector electrode and said emitter electrode, a source of direct current energizing potential connected to said collector electrode, first stabilizing means providing a relatively high resistance direct current carrying path between said collector and said base electrode, second stabilizing means providing a direct current carrying path between said emitter electrode and said base electrode and including resistance means and an additional source of direct current potential for stabilizing the operating point of said circuit in accordance with variations in the static operating characteristics of said semi-conductor device.

2. A semi-conductor amplifier circuit, comprising in combination a semi-conductor device including base, emitter and collector electrodes and exhibiting the characteristic of providing a phase reversal between the base and collector electrodes, means for applying an input signal to said base and emitter electrodes, an output circuit coupled with said collector and emitter electrodes, a source of energizing potential coupled to said collector electrode, stabilizing means including a first direct current conductive impedance element connected between said collector electrode and said base electrode, and a second direct current conductive impedance element and a second source of energizing potential connected in series between said base electrode and said emitter electrode for providing a bias current which is effectively controlled by the potential of said third electrode, said second source being poled in such a direction to provide a reverse bias between said base and emitter electrodes.

3. The semi-conductor amplifier circuit comprising, in combination, a semi-conductor device including base, emitter and collector electrodes and exhibiting the characteristic of providing a phase reversal between the base and collector electrodes, means for applying an input signal to said base and emitter electrodes, an output circuit including an output impedance element coupled between said collector and emitter electrodes, a source of direct current energizing potential coupled to said collector electrode, a first direct current conductive stabilizing means including an inductor and a resistor connected between said collector electrode and said base electrode, and a second direct current conductive stabilizing means including a resistor and a second source of direct current energizing potential connected between said base electrode and said emitter electrode for providing a bias current which is inherently adjusted in accordance with the variations in the static operating characteristics of said semi-conductor device.

4. A semi-conductor amplifier circuit, comprising in combination, a semi-conductor device including a base electrode, an emitter electrode and a collector electrode and exhibiting the characteristic of providing a phase reversal between the base and collector electrodes, signal input means coupled between said base electrode and said emitter electrode, signal output means including a load impedance having a low impedance at signal frequencies coupled between said collector electrode and said emitter electrode, a source of direct current energizing potential coupled with said collector electrode, a first stabilizing means providing a relatively high resistance direct current carrying path between said collector electrode and said base electrode and providing a low impedance signal path between an intermediate point on said first stabilizing means and said emitter electrode, and second stabilizing means providing a direct current conductive path between said base electrode and said emitter electrode and including an additional source of direct current energizing potential for stabilizing the operating point of said circuit said additional source being poled in such a direction as to apply a reverse bias between said base and emitter electrodes.

5. A semi-conductor amplifier circuit, comprising in combination, a semi-conductor device including a base electrode, an emitter electrode and a collector electrode and exhibiting the characteristic of providing a phase reversal between the base and collector electrodes, signal input means coupled between said base electrode and said emitter electrode, signal output means including a load impedance having a low impedance at signal frequencies coupled between said collector electrode and said emitter electrode, a source of direct current energizing potential coupled with said collector electrode, a first stabilizing means including a pair of resistors connected in series between said collector electrode and said base electrode, a capacitor connected between the junction of said pair of resistors and said emitter electrode, and second stabilizing means including a resistor and an additional source of direct current energizing potential connected in series between said base electrode and said emitter electrode for stabilizing the operating point of said circuit.

6. A semi-conductor amplifier circuit, comprising in combination, a semi-conductor device including a base electrode, an emitter electrode and a collector electrode and exhibiting the characteristic of providing a phase reversal between the base and collector electrodes, signal input means connected between said base electrode and said emitter electrode, an output load circuit and a source of direct current energizing potential connected in series arrangement between said collector electrode and said emitter electrode, a first stabilizing resistor connected between said collector electrode and said base electrode, and a second stabilizing resistor and an additional source of direct current energizing potential connected between said base electrode and said emitter electrode, said additional source being poled in such a direction to apply a reverse bias between said base and emitter electrodes whereby the operating point of said semi-conductor device is provided in accordance with variations in the static operating characteristic of said semi-conductor device.

7. A semi-conductor amplifier circuit, comprising in combination a semi-conductor device including base, emitter and collector electrodes and exhibiting the characteristic of providing a phase reversal between the base and collector electrodes, means for applying an input signal between said base and emitter electrodes, a parallel resonant output circuit, a resistor and a source of direct current energizing potential connected in the order named between said collector electrode and said emitter electrode, and stabilizing means including a first direct current conductive impedance element connected between the junction of said parallel resonant output circuit and said resistor and said base electrode and a second direct current conductive impedance element and a second source of energizing potential connected in series between said base and emitter electrodes for providing a bias current which is effectively controlled by the potential of said third electrode.

References Cited in the file of this patent

UNITED STATES PATENTS

| | | |
|---|---|---|
| 2,517,960 | Barney et al. | Aug. 8, 1950 |
| 2,533,001 | Eberhard | Dec. 5, 1950 |
| 2,647,957 | Mallinckrodt | Aug. 4, 1953 |
| 2,647,958 | Barney | Aug. 4, 1953 |
| 2,662,124 | McMillan | Dec. 8, 1953 |